United States Patent [19]

Kawamura et al.

[11] Patent Number: 5,958,646

[45] Date of Patent: *Sep. 28, 1999

[54] POSITIVE-WORKING PHOTOSENSITIVE COMPOSITION AND PROCESS FOR IMAGE FORMATION

[75] Inventors: Koichi Kawamura; Satoshi Takita; Keiji Akiyama; Yoshitaka Kawamura, all of Shizuoka, Japan

[73] Assignee: Fuji Photo Film Co., Ltd., Kanagawa, Japan

[*] Notice: This patent issued on a continued prosecution application filed under 37 CFR 1.53(d), and is subject to the twenty year patent term provisions of 35 U.S.C. 154(a)(2).

[21] Appl. No.: 08/569,316

[22] Filed: Dec. 8, 1995

Related U.S. Application Data

[63] Continuation of application No. 08/271,971, Jul. 8, 1994, abandoned.

[30] Foreign Application Priority Data

Jul. 9, 1993 [JP] Japan ................... 5-170484

[51] Int. Cl.$^6$ ........................................ G03C 1/52
[52] U.S. Cl. ............... 430/192; 430/193; 430/270.1; 430/271.1
[58] Field of Search ............... 430/270.1, 271.1, 430/192, 193, 906

[56] References Cited

U.S. PATENT DOCUMENTS

| | | | |
|---|---|---|---|
| 3,634,078 | 1/1972 | Uhlig | 430/161 |
| 3,964,908 | 6/1976 | Bargon et al. | 430/270 |
| 4,578,444 | 3/1986 | Rossi et al. | 526/288 |
| 4,684,599 | 8/1987 | DoMinh et al. | 430/270 |
| 4,857,435 | 8/1989 | Hopf et al. | 430/270 |
| 5,134,054 | 7/1992 | Iwasawa et al. | 430/192 |
| 5,380,612 | 1/1995 | Kojima et al. | 430/302 |

FOREIGN PATENT DOCUMENTS

| | | |
|---|---|---|
| 3742387 A1 | 6/1988 | Germany . |
| 2-39154 | 2/1990 | Japan . |
| 2-167550 | 6/1990 | Japan . |
| 2167550 | 6/1990 | Japan . |
| 3-58049 | 3/1991 | Japan . |

*Primary Examiner*—Maria Nuzzolillo
*Assistant Examiner*—Laura Weiner
*Attorney, Agent, or Firm*—Sughrue, Mion, Zinn, Macpeak & Seas, PLLC

[57] ABSTRACT

Disclosed are (i) a positive-working photosensitive composition containing (a) a polymer having at least 60 mol % structural units represented by formula (1):

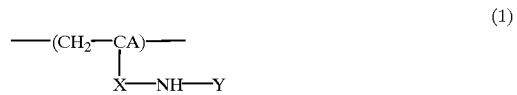

wherein A represents a hydrogen atom, a halogen atom, or an alkyl group having 1 to 4 carbon atoms; X represents —CO— or —SO$_2$—; Y represents —CO—R$_1$ or —SO$_2$—R$_1$, where R$_1$ represents an alkyl group, a substituted alkyl group wherein the substituent on the substituted alkyl group is a halogen atom, an aryl group, an amido group, an alkoxy group or an alkoxycarbonyl group, an unsubstituted aromatic group, or a substituted aromatic group wherein the substituent on the substituted aromatic group is a halogen atom, an alkyl group, an alkoxy group having 1 to 10 carbon atoms, an amido group or an aryl group, provided that at least one of X and Y contains —SO$_2$—and (b) a o-naphthoquinone diazide, and (ii) a process for image formation which comprises image-wise exposing to light a photosensitive material having a photosensitive layer comprising the positive-working photosensitive composition and then developing the resulting photosensitive material with an aqueous alkali solution having a pH of 12.5 or below.

14 Claims, No Drawings

POSITIVE-WORKING PHOTOSENSITIVE COMPOSITION AND PROCESS FOR IMAGE FORMATION

This is a continuation of application Ser. No. 08/271,971, filed Jul. 8, 1994 now abandoned.

FIELD OF THE INVENTION

The present invention relates to a photosensitive composition suitable for the manufacture of lithographic plates, IC circuits, and photomasks. More particularly, this invention relates to a photosensitive composition comprising a photosensitive compound, e.g., an o-naphthoquinone diazide compound, and a polymer soluble in either an alkaline aqueous solution or an alkaline solvent consisting mainly of water (hereinafter referred to as "soluble in an aqueous alkali solution").

BACKGROUND OF THE INVENTION

A photosensitive composition comprising an o-naphthoquinone diazide compound and a phenolic novolak resin has been industrially used as an exceedingly good photosensitive composition in the manufacture of lithographic plates and as a photoresist.

However, due to the properties of the phenolic novolak resin used as a major component, the composition has had drawbacks, for example, that it shows poor adherence to substrates and gives a coating film which is brittle, has poor wear resistance, and shows insufficient impression capacity when used in a lithographic plate. The applications of the composition has therefore been limited.

In order to overcome these problems, various polymers have been investigated as binders. For example, the poly(hydroxystyrene) or hydroxystyrene copolymer described in JP-B-52-41050 has undoubtedly improved film properties but has had a drawback of poor wear resistance. (The term "JP-B" as used herein means an "examined Japanese patent publication.")

On the other hand, in JP-A-63-226641 is described a positive-working photosensitive composition comprising as a binder an alkali-soluble polymer having an active imino group. (The term "JP-A" as used herein means an "unexamined published Japanese patent application.") There is a description therein to the effect that the composition is improved in film properties, adherence to substrates, and wear resistance. However, since the composition should be used in combination with a conventionally employed novolak resin so as to keep the range of proper development conditions wide, a lithographic plate having impression capacity on a sufficiently high level has not always been obtained.

Further, photosensitive compositions comprising a conventional phenolic resin have been disadvantageous in that they should be developed usually with an aqueous alkali solution having a pH as high as 13 or above and use of such a high-pH developing solution is never preferable from the standpoints of safety in handling and of treatment of the waste liquor resulting from development.

SUMMARY OF THE INVENTION

Accordingly, an object of the present invention is to provide a photosensitive composition which is developable with an aqueous alkali solution having a relatively low pH and gives a lithographic plate having good impression capacity. Another object of the present invention is to provide a photosensitive composition showing good adherence to substrates and giving a soft film.

As a result of intensive studies made by the present inventors, they have succeeded in developing a photosensitive composition useful for attaining the above objects. That is, the present invention provides a positive-working photosensitive composition containing a polymer having at least 60 mol % structural units represented by the following general formula (1):

$$—(CH_2—CA((B)_m—(X)_n—NH—Y))— \qquad (1)$$

wherein A represents a hydrogen atom, a halogen atom, or an alkyl group having 1 to 4 carbon atoms; B represents a phenylene group or a substituted phenylene group; X represents —CO— or —SO$_2$—; Y represents —CO—R$_1$ or —SO$_2$—R$_1$, where R$_1$ represents an alkyl group, a substituted alkyl group, an aromatic group, or a substituted aromatic group; and m and n each represents 0 or 1, provided that at least either is not 0.

DETAILED DESCRIPTION OF THE INVENTION

The polymer for use in this invention has in the molecular structure thereof an active imino group as shown in general formula (1) and contains this structural unit in an amount of 60 mol % or more. Due to dissociation at the active imino groups, the polymer dissolves in a developing solution which is an aqueous alkali solution having a pH of 12.5 or below.

The active imino groups in this invention have a degree of dissociation (pK$_a$) of 6 to 1, and preferably in the range of from 4 to 1, exclusive of 4. This pK$_a$ value for an active imino group means the value determined by dissolving a monomer having the active imino group into a 6:1 liquid mixture of 2-methoxyethanol and 0.35 N aqueous sodium chloride solution and titrating the solution with 0.1 N aqueous sodium hydroxide solution.

A polymer containing an active imino group as a structural unit has already been disclosed in JP-A-63-226641. However, it was utterly surprising to find that a polymer containing structural units of this kind in an amount of 60 mol % or more gives a photosensitive composition which is developable with an aqueous alkali solution having a pH of 12.5 or below, has good adherence to substrates and excellent wear resistance, and has a wide range of proper developing conditions (the development latitude is wide). In particular, it was more surprising to find that a polymer having at least 60 mol % monomer units having an active imino group with a pK$_a$ below 4 gives a photosensitive composition which is developable with a developing solution having a lower pH, has higher sensitivity, and is wider in the range of development conditions.

In general formula (1) given above, A is a hydrogen atom, a halogen atom, or an alkyl group having 1 to 4 carbon atoms, preferably a hydrogen atom or a methyl group.

B is a phenylene group or a substituted phenylene group. Preferably, B is a phenylene group or m=0. Preferred examples of the alkyl group represented by R$_1$ include linear, branched, or cyclic alkyl groups having 1 to 20 carbon atoms, e.g., methyl, ethyl, isopropyl, and cyclohexyl. Preferred examples of the substituted alkyl group include ones formed by substituting unsubstituted alkyl groups such as those enumerated above with a substituent such as a halogen atom, e.g., chlorine or bromine, an aryl group, e.g., phenyl, an amido group, e.g., acetamido, an alkoxy group, e.g., methoxy or butyloxy, or an alkoxycarbonyl group, e.g., ethoxycarbonyl. Preferred examples of the aromatic group represented by $R_1$ include aryl groups (carbocyclic aromatic groups), e.g., phenyl, naphthyl, and anthranyl, and heterocyclic aromatic groups, e.g., benzofuryl. Preferred examples of the substituent of the substituted aromatic group represented by $R_1$ include halogen atoms, e.g., chlorine and bromine, alkyl groups having 1 to 10 carbon atoms, e.g., methyl, ethyl, and butyl, alkoxy groups having 1 to 10 carbon atoms, e.g., methoxy and butyloxy, amido groups, e.g., acetamido, and aryl groups, e.g., phenyl.

The especially preferred structure of the polymer for use in this invention is one obtained by polymerizing a monomer represented by the following general formula (2) or (3) and having a $pK_a$ below 4.

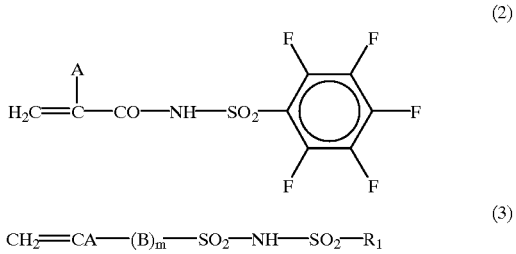

(2)

(3)

$$CH_2{=}CA{-}(B)_m{-}SO_2{-}NH{-}SO_2{-}R_1$$

In the formulae, A represents a hydrogen atom, a halogen atom, or an alkyl group having 1 to 4 carbon atoms; B represents a phenylene group or a substituted phenylene group; $R_1$ represents an alkyl group, an aromatic group, a substituted alkyl group, or a substituted aromatic group; and m represents 0 or 1. Examples of A, B, and $R_1$ in general formulae (2) and (3) include the same atoms and groups as those enumerated with regard to general formula (1).

The molecular weight of the polymer to be used in this invention may vary in a wide range. It is however desirable that the weight-average molecular weight ($M_w$) thereof as measured by gel permeation chromatography using polystyrene as a standard or measured by light scattering in THF be from 500 to 1,000,000, preferably from 4,000 to 500,000. The content of the polymer having active imino groups in the photosensitive composition of the present invention is from 20 to 95% by weight, preferably from 50 to 90% by weight. The polymer for use in this invention which has active imino groups may be a polymer made up of repeating units of the same structure represented by general formula (1), or may be a copolymer made up of structural units A represented by general formula (1) and structural units B which are also represented by general formula (1) but are different from the units A. The polymer may also be a copolymer having repeating structures, as comonomer units, derived from one or more ordinarily used vinyl monomers; this polymer should however contain structural units represented by general formula (1) in an amount of 60 mol % or more, preferably from 80 to 100 mol %.

Examples of the vinyl monomers that can be used in combination with the structural units represented by general formula (1) include structures formed by the cleavage of the unsaturated double bond in such vinyl monomers as ethylenically unsaturated olefins, e.g., ethylene, propylene, isobutylene, and butadiene, styrene compounds, e.g., styrene, α-methylstyrene, o-methylstyrene, m-methylstyrene, p-methylstyrene, o-chlorostyrene, and p-chlorostyrene, acrylic acid and esters thereof, e.g., acrylic acid, methyl acrylate, ethyl acrylate, isobutyl acrylate, n-butyl acrylate, hexyl acrylate, octyl acrylate, 2-hydroxyethyl acrylate, 2-cyanoethyl acrylate, glycidyl acrylate, and dimethylaminoethyl acrylate, methacrylic acid and esters thereof, e.g., methacrylic acid, methyl methacrylate, ethyl methacrylate, n-butyl methacrylate, isobutyl methacrylate, tert-butyl methacrylate, hexyl methacrylate, 2-ethylhexyl methacrylate, lauryl methacrylate, tridecyl methacrylate, cyclohexyl methacrylate, benzyl methacrylate, 2-hydroxyethyl methacrylate, 2-hydroxypropyl methacrylate, dimethylaminoethyl methacrylate, diethylaminoethyl methacrylate, glycidyl methacrylate, tetrahydrofurfuryl methacrylate, and allyl methacrylate, vinyl esters, e.g., vinyl acetate, vinyl propionate, vinyl butyrate, vinyl caproate, and vinyl benzoate, nitriles, e.g., acrylonitrile and methacrylonitrile, vinyl ethers, e.g., methyl vinyl ether, ethyl vinyl ether, isobutyl vinyl ether, β-chloroethyl vinyl ether, and cyclohexyl vinyl ether, acrylamide compounds, e.g., acrylamide, N-methylacrylamide, N,N-dimethylacrylamide, N-tert-butylacrylamide, N-octylacrylamide, and diacetone acrylamide, and N-vinyl-substituted compounds, e.g., N-vinylpyrrole, N-vinylcarbazole, N-vinylindole, and N-vinylpyrrolidone. Examples thereof further include the substituted styrenes having a phenolic hydroxyl group which are disclosed in JP-A-58-203433.

Representative examples of the polymer for use in this invention which has active imino groups are given in Table 1.

TABLE 1

Examples of the polymer having active imino groups

| No. | Structural formula | $pK_a$ |
|---|---|---|
| 1. |  —(CH$_2$CH)$_n$— with phenyl —SO$_2$—NH—CO—C$_2$H$_5$ | 4.7 |
| 2. |  —(CH$_2$CH)$_n$— with phenyl —SO$_2$—NH—CO—(CH$_2$)$_3$CH$_3$ | 4.8 |

TABLE 1-continued

Examples of the polymer having active imino groups

| No. | Structural formula | $pK_a$ |
|---|---|---|
| 3. | 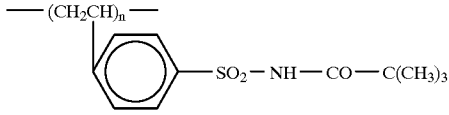 —(CH$_2$CH)$_n$— with phenyl—SO$_2$—NH—CO—C(CH$_3$)$_3$ | 4.5 |
| 4. | 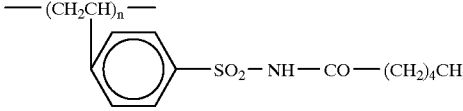 —(CH$_2$CH)$_n$— with phenyl—SO$_2$—NH—CO—(CH$_2$)$_4$CH$_3$ | 4.9 |
| 5. | 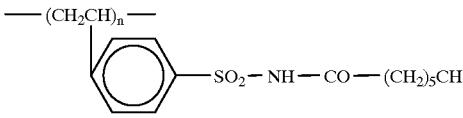 —(CH$_2$CH)$_n$— with phenyl—SO$_2$—NH—CO—(CH$_2$)$_5$CH$_3$ | 4.8 |
| 6. | 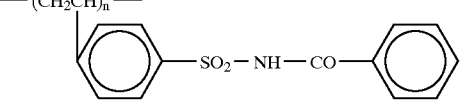 —(CH$_2$CH)$_n$— with phenyl—SO$_2$—NH—CO—phenyl | 4.5 |
| 7. | 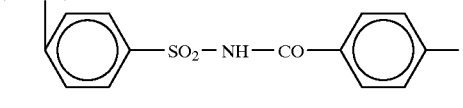 —(CH$_2$CH)$_n$— with phenyl—SO$_2$—NH—CO—phenyl—CH$_3$ | 4.5 |
| 8. | 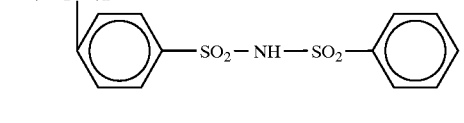 —(CH$_2$CH)$_n$— with phenyl—SO$_2$—NH—SO$_2$—phenyl | 1.3 |
| 9. | 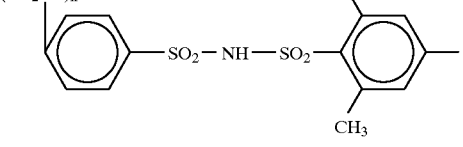 —(CH$_2$CH)$_n$— with phenyl—SO$_2$—NH—SO$_2$—(2,4,6-trimethylphenyl) | 1.3 |
| 10. | 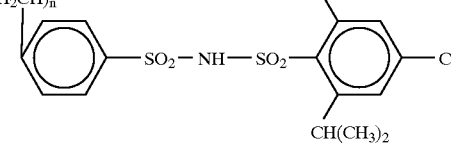 —(CH$_2$CH)$_n$— with phenyl—SO$_2$—NH—SO$_2$—(2,4,6-triisopropylphenyl) | 1.4 |
| 11. | 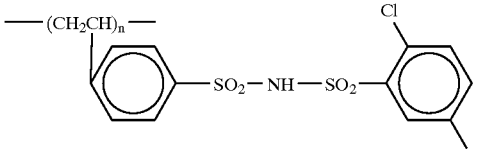 —(CH$_2$CH)$_n$— with phenyl—SO$_2$—NH—SO$_2$—(2,5-dichlorophenyl) | 1.4 |

TABLE 1-continued
Examples of the polymer having active imino groups
| No. | Structural formula | $pK_a$ |
|---|---|---|
| 12. | 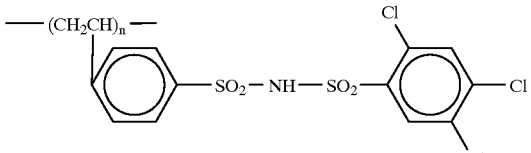 | 1.5 |
| 13. | 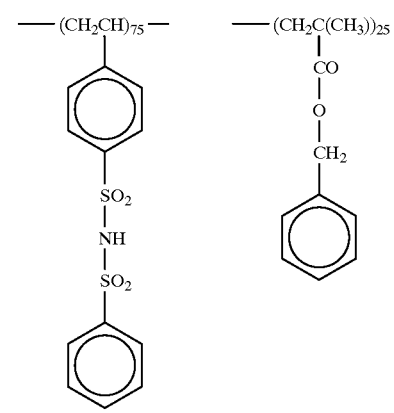 | 1.3 |
| 14. | 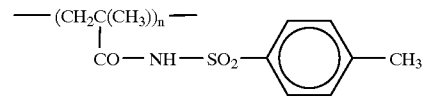 | 5.4 |
| 15. | 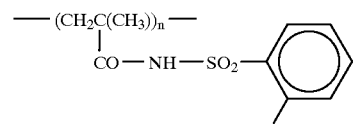 | 5.2 |
| 16. | 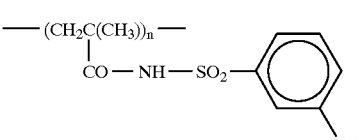 | 5.4 |
| 17. | 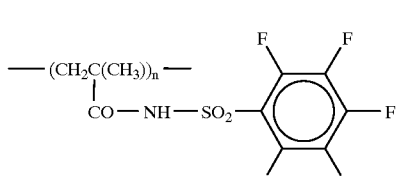 | 2.4 |
| 18. | 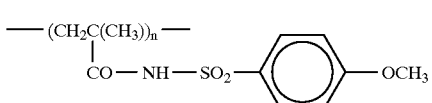 | 5.7 |
| 19. | 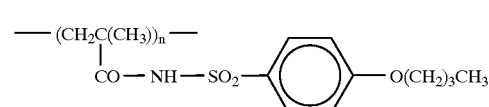 | 5.7 |

TABLE 1-continued

Examples of the polymer having active imino groups

| No. | Structural formula | pK$_a$ |
|---|---|---|
| 20. | —(CH$_2$C(CH$_3$))$_n$— with CO—NH—SO$_2$—(2-naphthyl) | 5.2 |
| 21. | —(CH$_2$C(CH$_3$))$_n$— with CO—NH—SO$_2$—C$_6$H$_4$—Cl (para) | 4.8 |
| 22. | —(CH$_2$C(CH$_3$))$_n$— with CO—NH—SO$_2$—C$_6$H$_4$—F (para) | 4.5 |
| 23. | —(CH$_2$C(CH$_3$))$_n$— with CO—NH—SO$_2$—C$_6$H$_4$—Br (para) | 4.9 |
| 24. | —(CH$_2$C(CH$_3$))$_n$— with CO—NH—SO$_2$—C$_6$H$_2$Cl$_3$ (2,4,5-trichloro) | 4.4 |
| 25. | —(CH$_2$C(CH$_3$))$_n$— with CO—NH—SO$_2$—(1-naphthyl) | 5.4 |
| 26. | —(CH$_2$C(CH$_3$))$_{50}$— with CO—NH—SO$_2$—C$_6$H$_4$—CH$_3$ (ortho) and —(CH$_2$C(CH$_3$))$_{50}$— with CO—NH—SO$_2$—C$_6$F$_5$ | 5.2 and 2.4 |
| 27. | —(CH$_2$C(CH$_3$))$_n$— with CO—NH—SO$_2$—C$_6$H$_4$—NH—CO—CH$_3$ | 5.2 |
| 28. | —(CH$_2$CH)$_n$— with CO—NH—SO$_2$—C$_6$H$_4$—CH$_3$ | 5.2 |

TABLE 1-continued

Examples of the polymer having active imino groups

| No. | Structural formula | $pK_a$ |
|---|---|---|
| 29. | 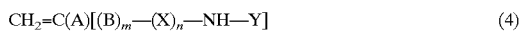 | 5.5 |

The polymer to be used in this invention, which has at least 60 mol % structural units represented by general formula (1) given above, can be obtained by polymerizing a monomer represented by general formula (4) given below either alone or together with other optional vinyl monomer(s) by the ordinary radical polymerization method:

$$CH_2=C(A)[(B)_m—(X)_n—NH—Y] \qquad (4)$$

(wherein A, B, X, Y, m, and n are the same as defined with regard to general formula (1)).

The monomer represented by general formula (4) given above can be easily synthesized by the following methods.

A. Reaction between a carboxylic acid halide or sulfonic acid halide and a carboxylic acid amide or sulfonic acid amide as shown by the following reaction scheme (5):

$$CH_2=C(A)[(B)_m—X—Cl]+Y—NH_2 \rightarrow CH_2=C(A)[(B)_m—X—NH—Y]+HCl \qquad (5)$$

(wherein A, B, X, Y, and m are the same as defined with regard to general formula (1)).

B. Reaction between a carboxylic acid amide or sulfonic acid amide and a carboxylic acid halide or sulfonic acid halide as shown by the following reaction scheme (6):

$$CH_2=C(A)[(B)_m—(X)_n—NH_2]+Y—Cl \rightarrow CH_2=C(A)[(B)_m—(X)_n—NH—Y]+HCl \qquad (6)$$

(wherein A, B, X, Y, m, and n are the same as defined with regard to general formula (1)).

C. Reaction between an acid anhydride and a carboxylic acid amide or sulfonic acid amide as shown by the following reaction scheme (7) or (8):

$$CH_2=C(A)—CO—O—COOR_2+Y—NH_2 \rightarrow CH_2=C(A)—CONH—Y+R_2OH+CO_2 \qquad (7)$$

$$CH_2=C(A)—CO—O—CO—C(A)=CH_2+Y—NH_2 \rightarrow CH_2=C(A)—CONH—Y+CH_2=C(A)—CO_2H \qquad (8)$$

(wherein A and Y are the same as defined with regard to general formula (1) and $R_2$ is an alkyl group).

D. Reaction between a carboxylic acid and a sulfonylisocyanate as shown by the following reaction scheme (9):

$$CH_2=C(A[(B)_m—COOH]+R_1—SO_2—NCO \rightarrow CH_2=C(A)[(B)_m—CONHSO_2—R_1]+CO_2 \qquad (9)$$

(wherein A, B, $R_1$, and m are the same as defined with regard to general formula (1)).

Of the above-described synthesis methods A to D, methods A to C are especially useful in that the starting materials are available at relatively low cost.

Representative synthesis examples for obtaining the polymer for use in this invention which has active imino groups are then given below, but these examples are not construed as limiting the scope of the invention.

SYNTHESIS EXAMPLE 1

Synthesis of N-(p-Toluenesulfonyl)methacrylamide

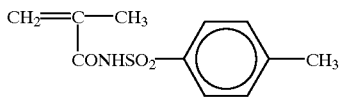

Into a 3-liter three-necked flask were introduced 256.8 g (1.5 mol) of p-toluenesulfonamide, 18.3 g (0.15 mol) of 4-(N,N-dimethylamino)pyridine, 333.9 g (3.3 mol) of triethylamine, and 800 ml of dimethylformamide. Subsequently, 200 ml of a dimethylformamide solution of 172.5 g (1.65 mol) of methacryloyl chloride was dropwise added thereto with stirring while the temperature of the contents in the flask was kept at 5 to 10° C. by cooling on an ice-water bath. After completion of the dropwise addition, the ice-water bath was removed and the mixture was stirred for 3 hours.

After completion of the reaction, the reaction mixture was poured into a beaker containing 1 g of 4-tert-butylcatechol, ethyl acetate, diluted hydrochloric acid, and ice. The resulting mixture was transferred to a separatory funnel, and the organic layer was washed twice with saturated aqueous common-salt solution.

The resulting organic layer was dried with magnesium sulfate and then filtered with suction. The solvent was distilled off while toluene was kept being added to the filtrate. As a result, crystals precipitated. The crystals were separated by filtration, washed with toluene, and then air-dried to thereby obtain 227.1 g of N-(p-toluenesulfonyl)methacrylamide (yield, 63.3%; white crystals; m.p., 155–155.5° C.

$^1$H-NMR ($d_6$-acetone): 1.86(S,3H), 2.84(S,3H), 5.66(S,1H), 5.98(S,1H), 7.42(d, J=8Hz,2H), 7.94(d, J=8Hz,2H); Elemental Analysis. Found value: C: 55.1%, H: 5.6%, N: 6.1%, S: 13.4%; Calculated value: C: 55.2%, H: 5.5%, N: 5.9%, S: 13.4%

SYNTHESIS EXAMPLE 2

Synthesis of N-(Pentafluorobenzenesulfonyl)-methacrylamide

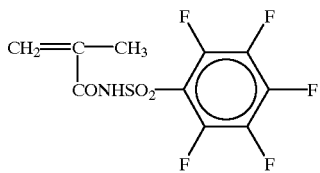

Using 24.7 g (0.1 mol) of pentafluorobenzene-sulfonamide, 1.2 g (0.01 mol) of 4-(N,N-dimethylamino) pyridine, 22.3 g (0.22 mol) of triethylamine, 13.5 g (0.12 mol) of methacryloyl chloride, and 100 ml of dimethylformamide, reaction was conducted in the same manner as in Synthesis Example 1. As a result, 19.5 g of N-(pentafluorobenzene-sulfonyl)methacrylamide was obtained (yield, 61.9%; light-yellow crystals; m.p., 133–133.5° C.).

$^1$H-NMR (d$_6$-acetone): 1.88(S,3H), 5.81(S,1H), 6.10(S, 1H); Elemental Analysis Found value: C: 37.9%, H: 2.0%, N: 4.5%, S: 10.0%; Calculated value: C: 38.1%, H: 1.9%, N: 4.4%, S: 10.2%

SYNTHESIS EXAMPLE 3

Synthesis of N-(2-Mesitylenesulfonyl)-p-styrene-sulfonamide

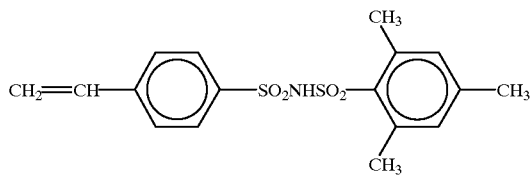

Using 55.0 g (0.3 mol) of p-styrenesulfonamide, 3.7 g (0.03 mol) of 4-(N,N-dimethylamino)pyridine, 82.0 g (0.81 mol) of triethylamine, 91.8 g (0.42 mol) of 2-mesitylenesulfonyl chloride, and 500 ml of acetonitrile, reaction was conducted in the same manner as in Synthesis Example 1. As a result, 70.9 g of N-(2-mesitylenesulfonyl)-p-styrenesulfonamide was obtained (yield, 64.7%; light-yellow crystals; m.p., 146.5–147° C.).

$^1$H-NMR (CDCl$_3$): 2.30(S,3H), 2.62(S,6H), 5.46(d,J= 11Hz,1H), 5.88(d,J=17.5Hz,1H), 6.73(dd,J=17.5,11Hz,1H), 6.94(S,2H), 7.45(d,J=9Hz,2H), 7.79(d,J=9Hz,2H) Elemental Analysis Found value: C: 55.6%, H: 5.3%, N: 3.8%, S: 17.8%; Calculated value: C: 55.9%, H: 5.2%, N: 3.8%, S: 17.5%

SYNTHESIS EXAMPLE 4

Synthesis of Exemplary Compound 14

In 145 g of dimethylformamide was dissolved 69.4 g (0.29 mol) of N-(p-toluenesulfonyl)methacrylamide. Thereto was added 433 mg of 2,2'-azobis(2,4-dimethylvaleronitrile) as an initiator. The resulting mixture was stirred at 65° C. for 7 hours, and the reaction product was then reprecipitated with 2 liters of methanol. The crystals were separated by filtration and dried to obtain 66.6 g of the desired compound 14 (yield, 96%; M$_w$, 72,000).

SYNTHESIS EXAMPLE 5

Synthesis of Exemplary Compound 17

In 100 g of dimethylformamide was dissolved 50.0 g (0.18 mol) of N-(pentafluorobenzenesulfonyl) methacrylamide. Thereto was added 593 mg of 2,2'-azobis (2,4-dimethyl-valeronitrile) as an initiator. The resulting mixture was stirred at 65° C. for 12 hours, and the reaction product was then reprecipitated with 1 liter of water. The crystals were separated by filtration and dried to obtain 41.0 g of the desired compound 17 (yield, 82%; M$_w$, 59,000).

SYNTHESIS EXAMPLE 6

Synthesis of Exemplary Compound 9

In 24.0 g of dimethylformamide was dissolved 12.0 g (0.03 mol) of N-(2-mesitylenesulfonyl)-p-styrenesulfonamide. Thereto was added 49 mg of 2,2'-azobis (2,4-dimethyl-valeronitrile) as an initiator. The resulting mixture was stirred at 65° C. for 6 hours, and the reaction product was then reprecipitated with 400 ml of methanol. The crystals were separated by filtration and dried to obtain 11.4 g of the desired compound 9 (yield, 95%; M$_w$, 19,000).

As a positive-working photosensitive compound for use in this invention, an o-naphthoquinone diazide compound is preferred. For example, the ester of 1,2-diazonaphthoquinonesulfonyl chloride with a pyrogallol-acetone resin or the ester of 1,2-diazonaphthoquinonesulfonyl chloride with 2,3,4-trihydroxybenzophenone is preferred which esters are disclosed in JP-A-43-28403.

Other orthoquinone diazide compounds such as ortho-naphthoquinone diazide and orthobenzoquinone diazide, which are suitable for use in this invention, include the ester of 1,2-diazonaphthoquinonesulfonyl chloride with a phenol-formaldehyde resin which ester is disclosed in U.S. Pat. Nos. 3,046,120 and 3,188,210. Other useful o-naphthoquinone diazide compounds are disclosed in JP-A-47-5303, JP-A-48-63802, JP-A-48-63803, JP-A-48-96575, JP-A-49-38701, JP-A-48-13354, JP-B-41-11222, JP-B-45-9610, JP-B-49-17481, U.S. Pat. Nos. 2,797,213, 3,454,400, 3,544,323, 3,573,917, 3,674,495, and 3,785,825, U.S. Pat. Nos. 1,227, 602, 1,251,345, 1,267,005, 1,329,888, and 1,330,932, and German Patent 854,890.

A positive-working photosensitive compound or mixture may be used in this invention in place of an o-naphthoquinone diazide compound. Examples thereof include the polymeric compound having a nitrocarbinol orthoester group as described in JP-B-56-2696.

Also usable in this invention is a photosensitive mixture comprising a compound which generates an acid upon photodecomposition and a compound having a C—O—C or C—O—Si group at which dissociation occurs by the action of the acid. Examples thereof include combinations of a compound generating an acid upon photodecomposition with an acetal or O,N-acetal compound (JP-A-48-89003), with an orthoester or amidoacetal compound (JP-A-51-120714), with a polymer having an acetal or ketal group in the backbone (JP-A-53-133429), with an enol ether compound (JP-A-55-12995), with an N-acyliminocarbonic acid compound (JP-A-55-126236), with a polymer having an orthoester group in the backbone (JP-A-56-17345), with a silyl ester compound (JP-A-60-10247), and with a silyl ether compound (JP-A-60-37549 and JP-A-60-121446).

The content of these positive-working photosensitive compounds or mixtures in the photosensitive composition of this invention is preferably from 5 to 80% by weight, more preferably from 10 to 50% by weight.

The composition of this invention may further contain a known alkali-soluble high-molecular compound, e.g., a phenol-formaldehyde resin, cresol-formaldehyde resin, phenol-modified xylene resin, poly(hydroxystyrene), or poly (halogenohydroxystyrene). Such an alkali-soluble high-molecular compound is used in an amount of 0 to 200% by weight, preferably 0 to 100% by weight, based on the amount of the polymer having at least 60 mol % structural units represented by general formula (1).

A cyclic acid anhydride for enhancing sensitivity, a printing-out agent for obtaining a visible image immediately after exposure to light, a dye as an image-coloring agent, a filler, and other ingredients may be added to the composition of the present invention. Examples of the cyclic acid anhydride include phthalic anhydride, tetrahydrophthalic anhydride, hexahydrophthalic anhydride, 3,6-endooxy-$\Delta^4$-tetrahydrophthalic anhydride, tetrachlorophthalic anhydride, maleic anhydride, chloromaleic anhydride, α-phenylmaleic anhydride, succinic anhydride, and pyromellitic anhydride, as described in U.S. Pat. No. 4,115,128. By incorporating these cyclic acid anhydrides in an amount of 1 to 15% by weight based on the amount of the whole composition, the sensitivity can be increased up to about three times.

Representative examples of the printing-out agent for obtaining a visible image immediately after exposure to light include a combination of a photosensitive compound which releases an acid upon exposure with an organic dye capable of forming a salt. Specific examples thereof include the combination of an o-naphthoquinonediazide-4-sulfonyl halide with a salt-forming organic dye as disclosed in JP-A-50-36209 and JP-A-53-8128 and the combination of a trihalomethyl compound with a salt-forming organic dye as disclosed in JP-A-53-36223 and JP-A-54-74728.

Examples of the image-coloring agent include the salt-forming organic dye mentioned above and other dyes. Preferred examples of the dyes including the salt-forming dye are oilsoluble dyes and basic dyes. Specific examples thereof include Oil Yellow #101, Oil Yellow #130, Oil Pink #312, Oil Green BG, Oil Blue BOS, Oil Blue #603, Oil Black BY, Oil Black BS, Oil Black T-505 (all manufactured by Orient Chemical Industries Ltd.), Crystal Violet (CI 42555), Methyl Violet (CI 42535), Rhodamine B (CI 45170 B), Malachite Green (CI 42000), and Methylene Blue (CI 52015).

Various additives may be incorporated into the photosensitive composition of the present invention. Examples of preferred additives include ingredients for improving applicability such as alkyl ethers (e.g., ethyl cellulose and methyl cellulose), fluorine compound surfactants (e.g., those enumerated in JP-A-62-170950 are preferred), and nonionic surfactants (fluorine compound surfactants are especially preferred), plasticizers for imparting flexibility and wear resistance to the coating film (e.g., butyl phthalyl, poly (ethylene glycol), tributyl citrate, diethyl phthalate, dibutyl phthalate, dihexyl phthalate, dioctyl phthalate, tricresyl phosphate, tributyl phosphate, trioctyl phosphate, tetrahydrofurfuryl oleate, and oligomer and polymer of acrylic or methacrylic acid, with tricresyl phosphate being especially preferred), and ink-receptivity agents for improving the ink-receptivity of image parts (e.g., the half-ester of a styrene-maleic anhydride copolymer with an alcohol as disclosed in JP-A-55-527, an octylphenol-formaldehyde novolak resin, and a p-hydroxystyrene 50% esterified with a fatty acid). The amount of these additives to be incorporated varies depending on the object to which the composition is to be applied, but the total amount of these additives is generally from 0.01 to 30% by weight based on the total solid content.

The composition of the present invention is applied on a support after the ingredients described above are dissolved in a solvent therefor. Examples of the solvent include ethylene dichloride, cyclohexanone, methyl ethyl ketone, ethylene glycol monomethyl ether, propylene glycol monomethyl ether, ethylene glycol monoethyl ether, 2-methoxyethyl acetate, propylene glycol monomethyl ether acetate, diethylene glycol monomethyl ether acetate, toluene, and ethyl acetate. These solvents are used alone or as a mixture thereof. The concentration of the above-described ingredients (solid content) is from 2 to 50% by weight. The coated amount varies depending on uses, but in the case of a photosensitive lithographic plate the preferred range thereof is generally from 0.5 to 3.0 g/m² on a solid basis. As the coated amount decreases, photosensitivity increases but the properties of the photosensitive film are impaired.

The photosensitive composition of the present invention is particularly suitable for use as the photosensitive layer of a photosensitive lithographic plate. Embodiments of the photosensitive lithographic plate are explained below in detail.

The support for use in this invention is desirably a dimensionally stable substance in plate or sheet form. As such a dimensionally stable plate or sheet, conventional printing-plate supports may be advantageously used in this invention. Examples of such supports include paper, laminates of paper with plastics (e.g., polyethylene, polypropylene, and polystyrene), plates or sheets of metals such as aluminum (including aluminum alloys), zinc, and copper, films of plastics such as cellulose diacetate, cellulose triacetate, cellulose propionate, cellulose acetate, cellulose acetate butyrate, cellulose nitrate, poly(ethylene terephthalate), polyethylene, polystyrene, polypropylene, polycarbonate, and poly(vinyl acetal), and paper or plastic films to which metals such as those enumerated above have been laminated or vapor-deposited. Of these supports, aluminum plate or sheet is preferred because it is exceedingly dimensionally stable and is inexpensive and because the photosensitive layer according to the invention or other coating adheres thereto especially tenaciously. Also preferred is a composite sheet produced by laminating an aluminum sheet with a poly(ethylene terephthalate) film, such as that disclosed in JP-B-48-18327.

In the case of a metallic support, particularly an aluminum support, the support desirably is one which has undergone a surface treatment, e.g., graining or anodizing. For the purpose of enhancing the hydrophilicity of the surface, the support may be further treated by immersing it in an aqueous solution of, e.g., sodium silicate, potassium fluorozirconate, or a phosphoric acid salt. Preferred are an aluminum plate or sheet which has undergone graining and then immersion in aqueous sodium silicate solution, as described in U.S. Pat. No. 2,714,066, and an aluminum plate or sheet which has undergone anodizing and then immersion in an aqueous solution of an alkali metal silicate, as described in JP-B-47-5125. Further, the electrodeposition of a silicate, such as that described in U.S. Pat. No. 3,658,662, is effective. Also useful is a surface treatment comprising a combination of electrolytic graining, the above mentioned anodizing, and treatment with sodium silicate, such as those disclosed in JP-B-46-27481, JP-A-52-58602, and JP-A-52-30503. Furthermore, a support which has undergone brush graining, electrolytic graining, anodizing, and treatment with sodium silicate in this order, such as that disclosed in JP-A-56-28893, is suitable.

(Organic Undercoating Layer)

An organic undercoating layer is formed, if necessary, on an aluminum plate or sheet before a photosensitive layer is formed by coating. The organic compound for use in this organic undercoating layer may be selected from, for example, carboxymethyl cellulose, dextrin, gum arabic, aminated phosphonic acids, e.g., 2-aminoethylphosphonic acid, organic phosphonic acids which may have a substituent, e.g., phenylphosphonic acid, naphthylphosphonic acid, alkylphosphonic acids, glycerophosphonic acid, methylenediphosphonic acid, and ethylenediphosphonic acid, organic phosphoric esters which may have a substituent, e.g., phenyl phosphate, naphthyl phosphate, alkyl phosphates, and glycero phosphate, organic phosphinic acids which may have a substituent, e.g., phenylphosphinic acid, naphthylphosphinic acid, alkylphosphinic acids, and glycerophosphinic acid, amino acids, e.g., glycine and β-alanine, and hydrochloric acid salts of hydroxylated amines, e.g., triethanolamine hydrochloride. A mixture of two or more thereof may be employed.

The organic undercoating layer can be formed by the following methods: i.e., a method in which a solution of the organic compound in water or an organic solvent, e.g., methanol, ethanol, or methyl ethyl ketone, or in a mixed solvent of these is applied on an aluminum plate or sheet and dried to form the organic undercoating layer; and a method in which an aluminum plate or sheet is immersed into a solution of the organic compound in water or an organic solvent, e.g., methanol, ethanol, or methyl ethyl ketone, or in a mixed solvent of these to thereby adsorb the organic compound onto the substrate and the resulting substrate is then rinsed with, e.g., water and dried to form the organic undercoating layer. In the former method, the solution of the organic compound at a concentration of 0.005 to 10% by weight can be applied by any of various techniques, e.g., bar coater coating, spin coating, spray coating, and curtain coating. In the latter method, the concentration of the solution is from 0.01 to 20% by weight, preferably from 0.05 to 5% by weight, the immersion temperature is from 20 to 90° C., preferably from 25 to 50° C., and the immersion time is from 0.1 second to 20 minutes, preferably from 2 seconds to 1 minute.

The solutions for the formation of an organic undercoating layer may be used after being regulated to have a pH in the range of 1 to 12 with a basic substance, e.g., ammonia, triethylamine, or potassium hydroxide, or an acidic substance, e.g., hydrochloric acid or phosphoric acid. It is also possible to add a yellow dye in order to improve the tone reproduction of the photosensitive lithographic plate.

The coated amount of the organic undercoating layer after drying is generally from 2 to 200 mg/m$^2$, preferably from 5 to 100 mg/m$^2$. Amounts thereof below 2 mg/m$^2$ result in insufficient press life. Amounts thereof above 200 mg/m$^2$ also cause the same problem.

The photosensitive layer of a photosensitive lithographic plate can be provided as mentioned above.

It is preferred to mat the surface of the photosensitive layer of the photosensitive lithographic plate in order to reduce the time required for evacuation in contact exposure using a vacuum frame and to prevent printing blur. Exemplary matting methods include a technique of forming a matting layer, such as those described in JP-A-50-125805, JP-B-57-6582, and JP-B-61-28986, and a technique of fusing solid particles to the surface, such as that described in JP-B-62-62337.

Examples of a light source for use in image-wise exposing the photosensitive lithographic plate according to the invention include a carbon arc lamp, mercury lamp, xenon lamp, tungsten lamp, and metal halide lamp.

As the developing solution for developing the photosensitive lithographic plate according to the invention, an aqueous alkali solution having a pH of 12.5 or below can be used. Preferably, an aqueous alkali solution having a pH of 8 to 11 is used. Examples of a basic compound to be used for obtaining such a pH value include phosphoric acid salts, e.g., sodium tertiary phosphate, potassium tertiary phosphate, ammonium tertiary phosphate, sodium secondary phosphate, potassium secondary phosphate, and ammonium secondary phosphate, carbonic acid salts, e.g., ammonium hydrogen carbonate, sodium carbonate, potassium carbonate, ammonium carbonate, sodium hydrogen carbonate, and potassium hydrogen carbonate, boric acid salts, e.g., sodium borate, potassium borate, and ammonium borate, alkali metal hydroxides, e.g., potassium hydroxide, sodium hydroxide, and lithium hydroxide, and ammonium hydroxide. Especially preferred are combinations of carbonates with hydrogen carbonates. These basic compounds are used alone or as a mixture thereof.

Basic compounds of other kind include water-soluble organic amine compounds such as, e.g., monomethylamine, dimethylamine, trimethylamine, monoethylamine, diethylamine, triethylamine, monoisopropylamine, diisopropylamine, n-butylamine, monoethanolamine, diethanolamine, triethanolamine, monoisopropanolamine, diisopropanolamine, ethyleneimine, ethylenediamine, and pyridine. Especially preferred examples are monoethanolamine, diethanolamine, triethanolamine, and the like. Such basic compounds may be used in combination with an inorganic alkali metal salt or the like.

The concentration of these basic compounds in the aqueous solution thereof is such a value that the solution has a pH of 12.5 or below, preferably from 8 to 11, as stated above. Generally however, the concentration may be selected from the range of 0.05 to 10% by weight.

An anionic surfactant may be added to the developing solution if desired. An organic solvent may also be added. Examples of the anionic surfactant include salts of sulfuric esters of higher alcohols having 8 to 22 carbon atoms, e.g., sodium lauryl sulfate, sodium octyl sulfate, ammonium lauryl sulfate, and secondary sodium alkyl sulfates, salts of phosphoric esters of aliphatic alcohols, e.g., sodium cetyl phosphate, salts of alkylarylsulfonic acids, e.g., sodium dodecylbenzenesulfonate, sodium isopropylnaphthalenesulfonate, and sodium m-nitrobenzenesulfonate, salts of sulfonic acids of alkylamides, e.g., $C_{17}H_{33}CON(CH_3)CH_2CH_2SO_3Na$, and salts of sulfonic acids and dibasic fatty esters, e.g., dioctyl sodium sulfosuccinate and dihexyl sodium sulfosuccinate.

The amount of the anionic surfactant to be incorporated is generally from 0 to 5% by weight, preferably from 0.1 to 5% by weight based on the total amount of the developing solution at the time of use. Amounts thereof above 5% by weight result in problems, for example, that the image part undergoes excessive dye dissolution into the developing solution (fading) and that the mechanical and chemical durability, e.g., wear resistance, of the image is impaired.

The organic solvent is selected desirably from ones having a solubility in water of 10% by weight or below (the soluble amount is 10 g or less per 100 g of water) at 23° C., preferably from ones having a solubility in water of 5% by weight or below. Examples thereof include 1-phenylethanol, 2-phenylethanol, 3-phenylpropanol-1, 4-phenylbutanol-1, 4-phenylbutanol-2, 2-phenylbutanol-1, 2-phenoxyethanol, 2-benzyloxyethanol, o-methoxybenzyl alcohol, m-methoxybenzyl alcohol, p-methoxybenzyl alcohol, benzyl alcohol, cyclohexanol, 2-methylcyclohexanol, 4-methylcyclohexanol, and 3-methylcyclohexanol.

The amount of the organic solvent to be contained is preferably from 1 to 5% by weight based on the total amount of the developing solution at the time of use. The organic solvent amount is closely related with the surfactant amount, so it is preferred that the amount of the anionic surfactant be increased as the amount of the organic solvent increases. This is because if an organic solvent is used in a large amount along with a small amount of an anionic surfactant, part of the organic solvent remains undissolved, making it impossible to ensure good development.

If desired, additives such as an anti-foaming agent and a water softener may be incorporated. Examples of the water softener include polyphosphoric acid salts, e.g., $Na_2P_2O_7$, $Na_5P_3O_3$, $Na_3P_3O_9$, $Na_2O_4P(NaO_3P)PO_3Na_2$, and Calgon (sodium polymetaphosphate); aminopolycarboxylic acids and derivatives thereof, such as ethylenediaminetetraacetic acid and its potassium salt and sodium salt, diethylenetriaminepentaacetic acid and its potassium salt and sodium salt, triethylenetetraminehexaacetic acid and its potassium salt and sodium salt, hydroxyethylethylenediaminetriacetic acid and its potassium salt and sodium salt, nitrilotriacetic acid and its potassium salt and sodium salt, 1,2-diaminocyclohexanetetraacetic acid and its potassium salt and sodium salt, and 1,3-diamino-2-propanoltetraacetic acid and its potassium salt and sodium salt; and organic phosphonic acids and derivatives thereof, such as 2-phosphonobutanetricarboxylic acid-1,2,4 and its potassium salt and sodium salt, 2-phosphonobutanetricarboxylic acid-2,3,4 and its potassium salt and sodium salt, 1-phosphonoethanetricarboxylic acid-1,2,2 and its potassium salt and sodium salt, 1-hydroxyethane-1,1-diphosphonic acid and its potassium salt and sodium salt, and aminotri(methylenephosphonic acid) and its potassium salt and sodium salt. The optimum amount of such a water softener varies depending on the hardness and amount of the hard water used. However, the water softener is generally added to the developing solution in an amount of 0.01 to 5% by weight, preferably 0.01 to 0.5% by weight, based on the amount of the developing solution at the time of use.

It is a matter of course that the photosensitive lithographic plate according to the invention may be processed by any of the methods described in JP-A-54-8002, JP-A-55-115045, and JP-A-59-58431. That is, the photosensitive lithographic plate which has undergone development may be washed with water and then be subject to desensitizing treatment, or may be subjected directly to desensitizing treatment, or to treatment with an aqueous solution of an acid, or to treatment with an aqueous solution of an acid and then desensitizing treatment. Since the developing solution used in the development of photosensitive lithographic plates of this kind becomes exhausted as the amount of the treated plates increases, a replenishing solution or a fresh developing solution may be used to recover the developing ability. In this case, it is preferred to conduct replenishing by the method described in U.S. Pat. No. 4,882,246.

It is preferred that the above-described processing be carried out on an automatic processor such as those described in JP-A-2-7054 and JP-A-2-32357.

In the case of erasing an unnecessary image part after the photosensitive lithographic plate according to the invention is image-wise exposed, developed, and washed or rinsed with water, it is preferable to use a deletion liquid such as that described in JP-B-2-13293. Further, preferred examples of a desensitizing gum which may be used, if desired, at the final step in the process for printing plate production include those given in JP-B-62-16834, JP-B-62-25118, JP-B-63-52600, JP-A-62-7595, JP-A-62-11693, and JP-A-62-83194. Furthermore, in the case of conducting burning after the photosensitive lithographic plate according to the invention is image-wise exposed, developed, washed or rinsed with water, subjected if desired to deletion, and then washed with water, it is preferred to conduct treatment with a burning conditioner such as those disclosed in JP-B-61-2518, JP-B-55-28062, JP-A-62-31859, and JP-A-61-159655 prior to the burning.

The present invention will be illustrated in more detail by reference to the following Examples. In the Examples, all percents are by weight unless otherwise indicated.

EXAMPLES 1 TO 7

The surface of each of aluminum sheets having a thickness of 0.30 mm was grained with a nylon brush and an aqueous suspension of a 400-mesh pumice, and then sufficiently washed with water. The grained aluminum sheets were etched by immersion in 10% sodium hydroxide at 70° C. for 60 seconds, washed with running water, subsequently neutralized and cleaned with 20% $HNO_3$, and washed with water. The aluminum sheets were then subjected to electrolytic surface-roughening treatment in 1% aqueous nitric acid solution using a sine-wave alternating current under conditions of $V_A$=12.7 V and a quantity of electricity of 160 $C/dm^2$ at the time of anode. The roughness of the roughened surfaces was measured and found to be 0.6 μm (in terms of $R_a$). Each aluminum sheet was subsequently immersed in 30% aqueous $H_2SO_4$ solution to desmut the surface at 55° C. for 2 minutes and then anodized in 20% aqueous $H_2SO_4$ solution at a current density of 2 $A/dm^2$ to such a degree that an oxide film was formed at a thickness of 2.7 $g/m^2$. The resulting sheets each was immersed in a 2.5% aqueous solution of sodium silicate at 70° C. for 1 minute, washed with water, and then dried. The surface of each of the thus-treated substrates was coated with an undercoating liquid (A) having the following composition, and the coating was dried at 80° C. for 30 seconds. The coated amount of the undercoating layer after drying was 30 $mg/m^2$.

Undercoating Liquid (A)

| | |
|---|---|
| Phenylphosphonic acid | 0.10 g |
| Methanol | 40 g |
| Pure water | 60 g |

Thus, substrates (I) were produced.

On the substrates (I) was then applied the following photosensitive liquid (A) by rod coating in an amount of 25 $ml/m^2$. The coating was dried at 100° C. for 1 minute to obtain positive-working photosensitive lithographic plates. The amount of this coating after drying was about 1.7 $g/m^2$.

Photosensitive Liquid (A)

| | |
|---|---|
| Product of esterification of 1,2-naphthoquinone-diazide-5-sulfonyl chloride with 2,3,4-trihydroxybenzophenone | 0.75 g |
| Polymer shown in Table 1 | 2.0 g |
| 2-(p-Butoxyphenyl)-4,6-bis (trichloromethyl)-s-triazine | 0.02 g |
| Naphthoquinone-1,2-diazide-4-sulfonyl chloride | 0.03 g |
| Crystal Violet | 0.01 g |
| Oil Blue #603 (manufactured by Orient Chemical Industries Ltd.) | 0.015 g |
| Ethylene dichloride | 18 g |
| 2-Methoxyethyl acetate | 12 g |

Each of these photosensitive lithographic plates was exposed to the light from a 2-KW metal halide lamp placed at a distance of 1 m therefrom through a positive transparency for 40 seconds.

The exposed photosensitive lithographic plates were developed under the following conditions. First, automatic processor STABLON 900NP manufactured by Fuji Photo Film Co., Ltd. was supplied with a developing solution (pH 10) prepared by diluting the following undiluted developer-1 four times with water and further supplied with Finisher FP-2 manufactured by Fuji Photo Film Co., Ltd. Development was then performed under conditions of a developer temperature of 30° C. and a development time of 30 seconds.

Undiluted Developer-1

| | |
|---|---|
| Sodium carbonate monohydrate | 6 g |
| Sodium hydrogen carbonate | 3 g |
| Ethylenediaminetetraacetic acid | 2 g |
| Sodium dodecylbenzenesulfonate | 1 g |
| Water | 100 g |

After the development, the samples were examined as to whether an image had been obtained or not.

The samples were evaluated as follows.

1. Image-forming ability and Sensitivity

The evaluation of image-forming ability and sensitivity was conducted using a Fuji PS step guide (manufactured by Fuji Photo Film Co., Ltd.) which was composed of 15 step tablets each having different transmission optical density by 0.15 in order wherein the 1st step has a transmission optical density of 0.05 as a positive transparent original. The sensitivity as used herein means the number of the step (clear sensitivity) at the portion dissolved and removed completely by exposure and development.

The criterion is as follows.

A: A positive image is obtained and the sensitivity is the 3rd step or more.

B: A positive image is obtained and the sensitivity ranges from the 2nd step to less than the 3rd step.

C: A positive image is obtained and the sensitivity ranges from the 1st step to less than the 2nd step.

D: A poor positive image is obtained.

E: A positive image is not obtained due to underdevelopment or overdevelopment.

2. Press Life

The samples which had given an image were processed in an ordinary way to obtain lithographic plates. The lithographic plates thus obtained were used for printing on an offset press to evaluate press life in terms of the number of the obtained normal prints. Samples with poor press life become unable to give normal prints after giving a limited number of prints because the ink comes not to adhere thereto due to the rapid wear of the image part.

3. Development Time Latitude

On the other hand, for the purpose of examining the extent of the range of proper development conditions (development latitude), a Fuji PS step guide mentioned above was used and the exposed photosensitive lithographic plates were developed by 2-minute immersion in the developing solution described above, and compared with the samples developed by 30-second immersion to examine a change in tone reproduction.

The evaluation was conducted in terms of the difference in the step number (between 2-minute immersion and 30-second immersion) as follows.

A: 2 steps or less

B: more than 2 to 3 steps

C: more than 3 to 4 steps

D: more than 4 to 5 steps

E: more than 5 steps

The results obtained are summarized in Table 2.

Further, compounds which are shown in JP-A-63-226641 were used for the purpose of comparison.

Table 2 clearly shows that the photosensitive compositions of this invention have exceedingly high performances.

Further, the exposed photosensitive lithographic plates were also developed by 5-minute immersion, and compared with the samples developed by 30-second immersion. The obtained results were similar to the above.

TABLE 2

Kind and performance of polymers

| Run No. | Polymer | Image-Forming Ability | Development Time Latitude | Press Life (sheets) |
|---|---|---|---|---|
| Ex. | | | | |
| 1 | No. 7 | B | B | 150,000 |
| 2 | No. 9 | A | A | 100,000 |
| 3 | No. 13 | A | A | 110,000 |
| 4 | No. 14 | B | A | 160,000 |
| 5 | No. 15 | B | A | 150,000 |
| 6 | No. 17 | A | A | 110,000 |
| 7 | No. 26 | B | A | 130,000 |
| Comp. Ex. | | | | |
| 1 | copolymer of methyl methacrylate and methacrylic acid (8:2 by mol) | E (overdevelopment) | — | — |
| 2 | poly(hydroxystyrene) | D | C | 90,000 |
| 3 | m-cresol novolak resin | E (underdevelopment) | — | — |
| 4 | No. C-1 | D | B | 120,000 |
| 5 | No. C-2 | D | B | 110,000 |

Compound C-1

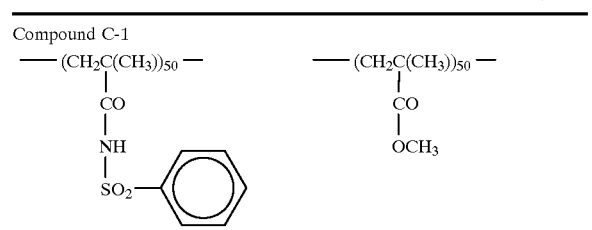

Compound C-2

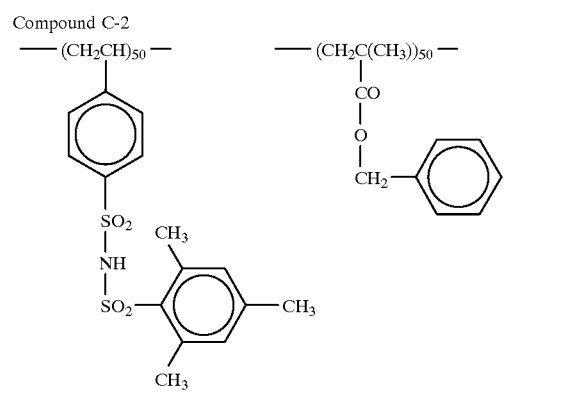

EXAMPLES 8 TO 12

The surface of each of JIS A 1050 aluminum sheets having a thickness of 0.24 mm was subjected to brush graining treatment using the rotary nylon brushes specified below, while an aqueous suspension of a pumice having an average particle diameter of about 21 $\mu$m was kept being supplied to the aluminum surface. The brushes were composed of a first brush having a bristle length of 100 mm, bristle diameter of 0.95 mm, and bristling density of 70 bristles per cm² and a second brush having a bristle length of 80 mm, bristle diameter of 0.295 mm, and bristling density of 670 bristles per cm², with the rotational speed being 250 rpm for each brush roll. After the brush graining, the aluminum sheets were sufficiently washed with water and then etched by immersion in 10% sodium hydroxide at 60° C. for 25 seconds. The resulting aluminum sheets were washed with running water, subsequently neutralized and cleaned with 20% nitric acid, and then washed with water. These aluminum sheets were subjected to electrolytic surface-roughening treatment in 1% aqueous nitric acid solution using a sine-wave alternating current under conditions of $V_A=12.7$ V and a quantity of electricity of 160 C/dm² at the time of anode. The roughness of the roughened surfaces was measured and found to be 0.79 μm (in terms of $R_a$). Each aluminum sheet was subsequently immersed in 1% aqueous sodium hydroxide solution at 40° C. for 30 seconds and then immersed in 30% aqueous sulfuric acid solution to desmut the surface at 60° C. for 40 seconds. Thereafter, the resulting aluminum sheets were anodized in 20% aqueous sulfuric acid solution at a direct current density of 2 A/dm² to such a degree that an oxide film was formed in an amount of 1.6 g/m². Thus, substrates (II) were produced.

The substrates (II) were then immersed in a 2.5% aqueous solution of sodium silicate at 40° C. for 1 minute and dried. The surface of each of the thus-treated substrates was coated with the undercoating liquid (A) and the coating was dried, under the same conditions as in Examples 1 to 7. The photosensitive liquid (A) was then applied on the under-coated substrates and dried in the same manner as in Examples 1 to 7 to obtain positive-working photosensitive lithographic plates. Each of these photosensitive lithographic plates was exposed to the light from a 2-KW metal halide lamp placed at a distance of 1 m therefrom through a positive transparency for 40 seconds.

The exposed photosensitive lithographic plates were developed under the following conditions. First, automatic processor STABLON 900NP manufactured by Fuji Photo Film Co., Ltd. was supplied with a developing solution (pH 10.5) prepared by diluting the following undiluted developer-2 four times with water and further supplied with Finisher FP-2 manufactured by Fuji Photo Film Co., Ltd. Development was then performed under conditions of a developer temperature of 30° C. and a development time of 30 seconds.

Undiluted Developer-2

| | |
|---|---|
| Sodium carbonate monohydrate | 9 g |
| Sodium hydrogen carbonate | 1.5 g |
| Diethylenetriaminepentaacetic acid | 2 g |
| Sodium m-nitrobenzenesulfonate | 1 g |
| Water | 100 g |

After the development, the samples were evaluated as to whether an image had been obtained or not, in the same manner as in Examples 1 to 7.

The samples which had given an image were processed in an ordinary way to obtain lithographic plates. The lithographic plates thus obtained were used for printing on an offset press to evaluate press life.

Further, the extent of the range of proper development conditions (development latitude) was evaluated by the same method as in Examples 1 to 7. The results obtained are summarized in Table 3. Table 3 clearly shows that the photosensitive compositions of this invention have exceedingly high performances.

TABLE 3

Kind and performance of polymers

| Run No. | Polymer | Image-Forming Ability | Development Time Latitude | Press Life (sheets) |
|---|---|---|---|---|
| Ex. | | | | |
| 8 | No. 1 | B | A | 120,000 |
| 9 | No. 4 | B | A | 140,000 |
| 10 | No. 8 | A | B | 110,000 |
| 11 | No. 11 | A | A | 130,000 |
| 12 | No. 20 | C | A | 160,000 |
| Comp. Ex. | | | | |
| 6 | copolymer of benzyl acrylate and acrylic acid (6:4 by mol) | D | E | 50,000 |
| 7 | poly(m-bromo-p-hydroxystyrene) | D | D | 60,000 |
| 8 | phenol novolak resin | E (under-development) | — | — |
| 9 | No. C-3 | C | C | 100,000 |
| 10 | No. C-4 | C | B | 130,000 |

Compound C-3

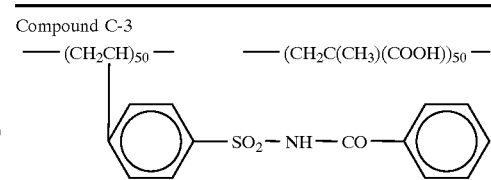

Compound C-4

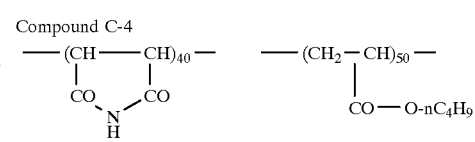

EXAMPLES 13 TO 17

Substrates (II) were produced by treating aluminum sheets under the same conditions as in Examples 8 to 12. The following photosensitive liquid (B) was then applied on the substrates with a whirler and dried at 100° C. for 1 minute to obtain positive-working photosensitive lithographic plates. The amount of the coating after drying was about 1.7 g/m².

Photosensitive Liquid (B)

| | |
|---|---|
| Product of esterification of 1,2-diazonaphtho-quinone-5-sulfonyl chloride with a pyrogallol-acetone resin (the compound described in Example 1 in U.S. Pat. No. 3,635,709) | 0.45 g |
| Polymer shown in Table 1 | 1.2 g |
| Naphthoquinonediazide-1,2-diazide-4-sulfonyl chloride | 0.01 g |
| Tetrahydrophthalic anhydride | 0.02 g |
| Benzoic acid | 0.02 g |
| Pyrogallol | 0.05 g |
| 4-[p-N,N-Bis(ethoxycarbonylmethyl)aminophenyl]-2,6-bis(trichloromethyl)-s-triazine (hereinafter abbreviated as "triazine A") | 0.02 g |
| N-(1,2-naphthoquinone-2-diazide-4-sulfonyloxy)-cyclohexane-1,2-dicarboxylic acid imide | 0.01 g |
| Dye obtained from Victoria Pure Blue BOH (manufactured by Hodogaya Cheinical Co., Ltd.) by converting the counter anion into 1-naphthalene- | 0.045 g |

-continued

| | |
|---|---|
| sulfonic acid | |
| MEGAFAC F-177 (fluorine compound surfactant manufactured by Dainippon Ink & Chemicals Inc.) | 0.015 g |
| Methyl ethyl ketone | 25 g |
| Propylene glycol monomethyl ether | 10 g |

Each of these photosensitive lithographic plates was then exposed in a vacuum frame to the light from a 3-kW metal halide lamp placed at a distance of 1 m therefrom though a positive transparency for 1 minute, and then developed with a 3.5% aqueous solution (pH=12.4) of sodium silicate having an $SiO_2/Na_2O$ molar ratio of 2.0 at 30° C. for 30 seconds.

After the development, the samples were evaluated as to whether an image had been obtained or not, in the same manner as in Examples 1 to 7. The samples which had given an image were processed in an ordinary way to obtain lithographic plates. The lithographic plates thus obtained were used for printing on an offset press to evaluate press life. Further, the extent of the range of proper development conditions (development latitude) was evaluated by the same method as in Examples 1 to 7. The results obtained are summarized in Table 4. Table 4 clearly shows that the photosensitive compositions of this invention have exceedingly high performances.

TABLE 4

Kind and performance of polymers

| Run No. | Polymer | Image-Forming Ability | Development Time Latitude | Press Life (sheets) |
|---|---|---|---|---|
| Ex. | | | | |
| 13 | No. 3 | B | B | 120,000 |
| 14 | No. 12 | A | A | 140,000 |
| 15 | No. 20 | C | A | 150,000 |
| 16 | No. 24 | B | A | 110,000 |
| 17 | No. 29 | B | A | 180,000 |
| Comp. Ex. | | | | |
| 11 | copolymer of ethyl acrylate and methacrylic acid (7:3 by mol) | D | E | 80,000 |
| 12 | poly(2,4-di-hydroxystyrene) | C | C | 60,000 |
| 13 | catechol novolak resin | D | E | 50,000 |
| 14 | No. C-5 | C | B | 120,000 |
| 15 | No. C-6 | C | A | 130,000 |

Compound C-5

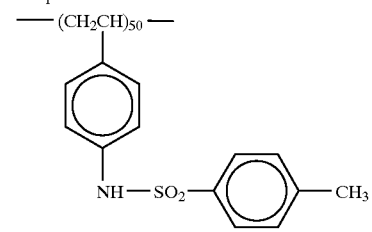

—(CH$_2$C(CH$_3$))$_{25}$—
 |
 CO—OCH$_3$

TABLE 4-continued

Kind and performance of polymers

| Run No. | Polymer | Image-Forming Ability | Development Time Latitude | Press Life (sheets) |
|---|---|---|---|---|

—(CH$_2$C(CH$_3$))$_{25}$—
 |
 CO—OH

Compound C-6

—(CH$_2$CH)$_{25}$—
 |
 CN

—(CH$_2$C(CH$_3$))$_{50}$—
 |
 CO
 |
 O
 |
 CH$_2$—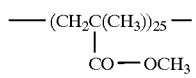

—(CH$_2$C(CH$_3$))$_{25}$—
 |
 CO—OH

EXAMPLES 18 TO 22

Substrates (I) were produced by treating aluminum sheets under the same conditions as in Examples 1 to 7. The photosensitive liquid (B) was then applied on the substrates and dried in the same manner as in Examples 13 to 17 to obtain positive-working photosensitive lithographic plates. The amount of the coating after drying was 2.0 g/m². Each of these photosensitive lithographic plates was exposed to the light from a 2-KW metal halide lamp placed at a distance of 1 m therefrom through a positive transparency for 40 seconds.

The exposed photosensitive lithographic plates were developed under the following conditions. First, automatic processor STABLON NP manufactured by Fuji Photo Film Co., Ltd. was supplied with a developing solution (pH 10) prepared by diluting the following undiluted developer-3 two times with water and further supplied with Finisher FP-2 manufactured by Fuji Photo Film Co., Ltd. Development was then performed under conditions of a developer temperature of 30° C. and a development time of 30 seconds. Undiluted Developer-3

| | |
|---|---|
| Benzyl alcohol | 10 g |
| Triethanolamine | 10 g |
| Sodium isopropylnaphthalenesulfonate | 10 g |
| Water | 500 g |

After the development, the samples were evaluated in terms of image-forming ability and sensitivity and press life in the same manner as in Examples 1 to 7 and in terms of developer concentration latitude described below.

Developer Concentration Latitude

For the purpose of examining the extent of the range of proper development conditions, the exposed photosensitive lithographic plates were developed by immersion in a developing solution prepared by diluting the above-described undiluted developer-3 with water 1.5 times, and compared with the samples developed by immersion in the 2-fold diluted developing solution to examine a change in tone reproduction.

The evaluation was conducted in terms of the difference in the step number as follows.

A: 2 steps or less
B: more than 2 to 3 steps
C: more than 3 to 4 steps
D: more than 4 to 5 steps The obtained results are shown in Table 5 below.

TABLE 5

Kind and performance of polymers

| Run No. | Polymer | Image-Forming Ability | Developer Concentration Latitude | Press Life (sheets) |
|---|---|---|---|---|
| Ex. | | | | |
| 18 | No. 6 | B | B | 110,000 |
| 19 | No. 11 | A | A | 130,000 |
| 20 | No. 19 | B | A | 120,000 |
| 21 | No. 21 | C | A | 130,000 |
| 22 | No. 28 | B | A | 160,000 |
| Comp. Ex. | | | | |
| 16 | copolymer of hydroxyphenyl-methacrylamide and ethyl acrylate | D | D | 80,000 |
| 17 | poly(o-chloro-hydroxystyrene) | D | C | 70,000 |
| 18 | pyrogallol novolak resin | E (over-development) | — | — |
| 19 | No. C-7 | C | A | 110,000 |
| 20 | No. C-8 | C | B | 120,000 |

Compound C-7

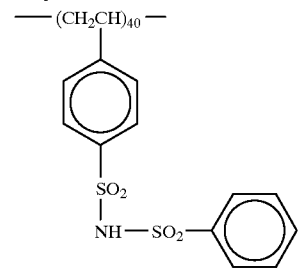

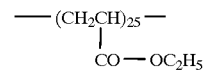

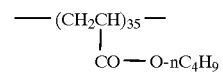

Compound C-8

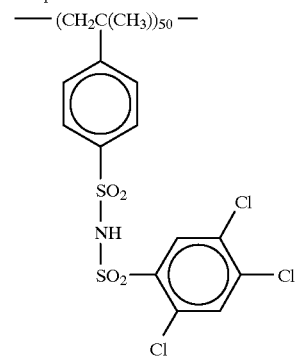

TABLE 5-continued

Kind and performance of polymers

| Run No. | Polymer | Image-Forming Ability | Developer Concentration Latitude | Press Life (sheets) |
|---|---|---|---|---|

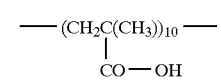

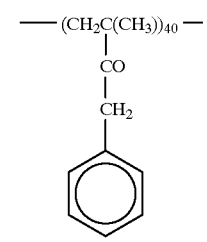

Table 5 clearly shows that the photosensitive compositions of this invention have exceedingly high performances.

The photosensitive composition of this invention which contains a polymer having active imino groups has not only good developability and press life but also excellent adherence to substrates.

While the invention has been described in detail and with reference to specific embodiments thereof, it will be apparent to one skilled in the art that various changes and modifications can be made therein without departing from the spirit and scope thereof.

What is claimed is:

1. A positive-working photosensitive composition containing:

(a) a polymer having at least 60 mol % structural units represented by formula (3):

$$CH_2=CA-(B)_m-SO_2-NH-SO_2-R_1 \qquad (3)$$

wherein A represents a hydrogen atom, a halogen atom, or an alkyl group having 1 to 4 carbon atoms; B represents a phenylene group; $R_1$ represents an alkyl group, a substituted alkyl group (wherein the substituent on the substituted alkyl group is a halogen atom, an aryl group, an amido group, an alkoxy group or an alkoxycarbonyl group), an aromatic group, or a substituted aromatic group (wherein the substituent on the substituted aromatic group is a halogen atom, an alkyl group, an alkoxy group having 1 to 10 carbon atoms, an amido group or an aryl group); and m represents 0 or 1, and (b) an o-naphthoquinone diazide.

2. The positive-working photosensitive composition of claim 1, wherein $R_1$ represents an alkyl-substituted phenyl group halogen-substituted phenyl group or alkoxy-substituted phenyl group.

3. The positive-working photosensitive composition of claim 1, wherein the polymer has the structural unit represented by formula (3) in an amount of from 80 to 100 mol %.

4. The positive-working photosensitive composition of claim 1, wherein the composition contains the polymer in an amount of from 20 to 95 mol %.

5. A positive-working photosensitive composition containing:

(a) a polymer having at least 60 mol % structural units represented by formula (4):

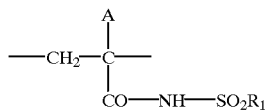
(4)

wherein A represents a hydrogen atom, a halogen atom, or an alkyl group having 1 to 4 carbon atoms and $R_1$ is an alkyl-substituted, halogen-substituted, phenyl group or alkoxy-substituted phenyl group, and (b) an o-naphthoquinone diazide.

6. The positive-working photosensitive composition of claim 5, wherein the polymer has the structural units represented by formula (4) in an amount of from 80 to 100 mol %.

7. The positive-working photosensitive composition of claim 5, wherein the composition contains the polymer in an amount of from 20 to 95 mol %.

8. The positive-working photosensitive composition of claim 5, wherein the polymer is one having 100 mol % structural units represented by

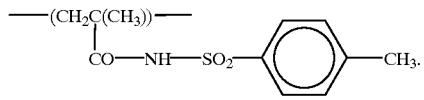

9. The positive-working photosensitive composition of claim 5, wherein the polymer is one having 100 mol % structural units represented by

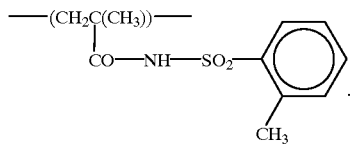

10. The positive-working photosensitive composition of claim 5, wherein the polymer is one having 100 mol % structural units represented by

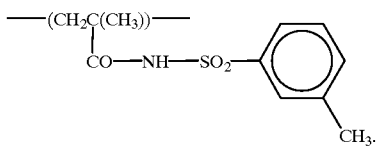

11. The positive-working photosensitive composition of claim 5, wherein the polymer is one having 100 mol % structural units represented by

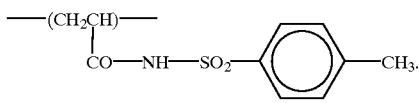

12. A positive-working photosensitive composition containing:

(a) a polymer having at least 60 mol % structural units represented by formula (2):

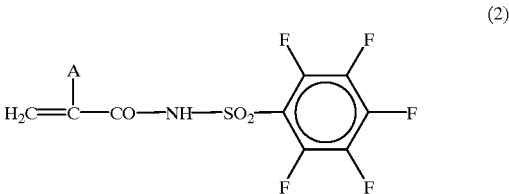
(2)

wherein A represents a hydrogen atom, a halogen atom, or an alkyl group having 1 to 4 carbon atoms, and (b) an o-naphthoquinone diazide.

13. The positive-working photosensitive composition of claim 12, wherein the polymer has the structural unit represented by formula (2) in an amount of from 80 to 100 mol %.

14. The positive-working photosensitive composition of claim 12, wherein the composition contains the polymer in an amount of from 20 to 95 mol %.

* * * * *